United States Patent [19]

Kobayashi

[11] Patent Number: 4,947,282

[45] Date of Patent: Aug. 7, 1990

[54] THYRISTOR VALVE WITH IMPROVED GATE PULSE GENERATING SCHEME

[75] Inventor: Sumio Kobayashi, Kokubunji, Japan

[73] Assignee: Kabushiki Kaisha Toshiba, Kawasaki, Japan

[21] Appl. No.: 169,471

[22] Filed: Mar. 17, 1988

[30] Foreign Application Priority Data

Mar. 19, 1987 [JP] Japan .................. 62-62525

[51] Int. Cl.⁵ .............................. H02H 5/24
[52] U.S. Cl. ........................... 361/91; 361/56
[58] Field of Search ............ 361/56, 58, 86, 91

[56] References Cited

U.S. PATENT DOCUMENTS

| | | | |
|---|---|---|---|
| 4,414,599 | 11/1983 | Kobayashi | 361/91 |
| 4,536,816 | 8/1985 | Matsumura et al. | 361/91 |
| 4,651,251 | 3/1987 | Thiele | 361/91 |
| 4,656,554 | 4/1987 | Maschek et al. | 361/56 |
| 4,665,458 | 5/1987 | Matsuoka et al. | 361/91 X |
| 4,697,219 | 9/1987 | Mitsuoka | 361/91 X |

FOREIGN PATENT DOCUMENTS

| | | |
|---|---|---|
| 0061343 | 9/1982 | European Pat. Off. |
| 2530789 | 1/1977 | Fed. Rep. of Germany. |
| 3046403 | 9/1981 | Fed. Rep. of Germany. |
| 3322873 | 6/1983 | Fed. Rep. of Germany. |
| 61-6612 | 2/1986 | Japan. |

OTHER PUBLICATIONS

IEEE Transactions on PAS, vol. PAS-102, No. 8, Aug. 1983, (pp. 2786–2791), S. Kobayashi et al.

Primary Examiner—Derek S. Jennings
Attorney, Agent, or Firm—Oblon, Spivak, McClelland, Maier & Neustadt

[57] ABSTRACT

A thyristor valve circuit protected having an arrester to protect it from an overvoltage. The circuit includes a voltage detector for detecting a forward voltage level applied to the thyristor valve and generating a signal sVp when the detected voltage level exceeds a predetermined voltage which is set lower than the protection level of the arrester, and a circuit for generating a gate pulse applied to the thyristor valve in response to the signal sVp* from the voltage detector. The gate pulse generating circuit permits the gate pulse to be applied to the thyristor only when the condition of the presence of conduction command signal PHS and forward voltage signal FV, and the absence of output signal sVp* of the voltage detector, is satisfied.

9 Claims, 11 Drawing Sheets

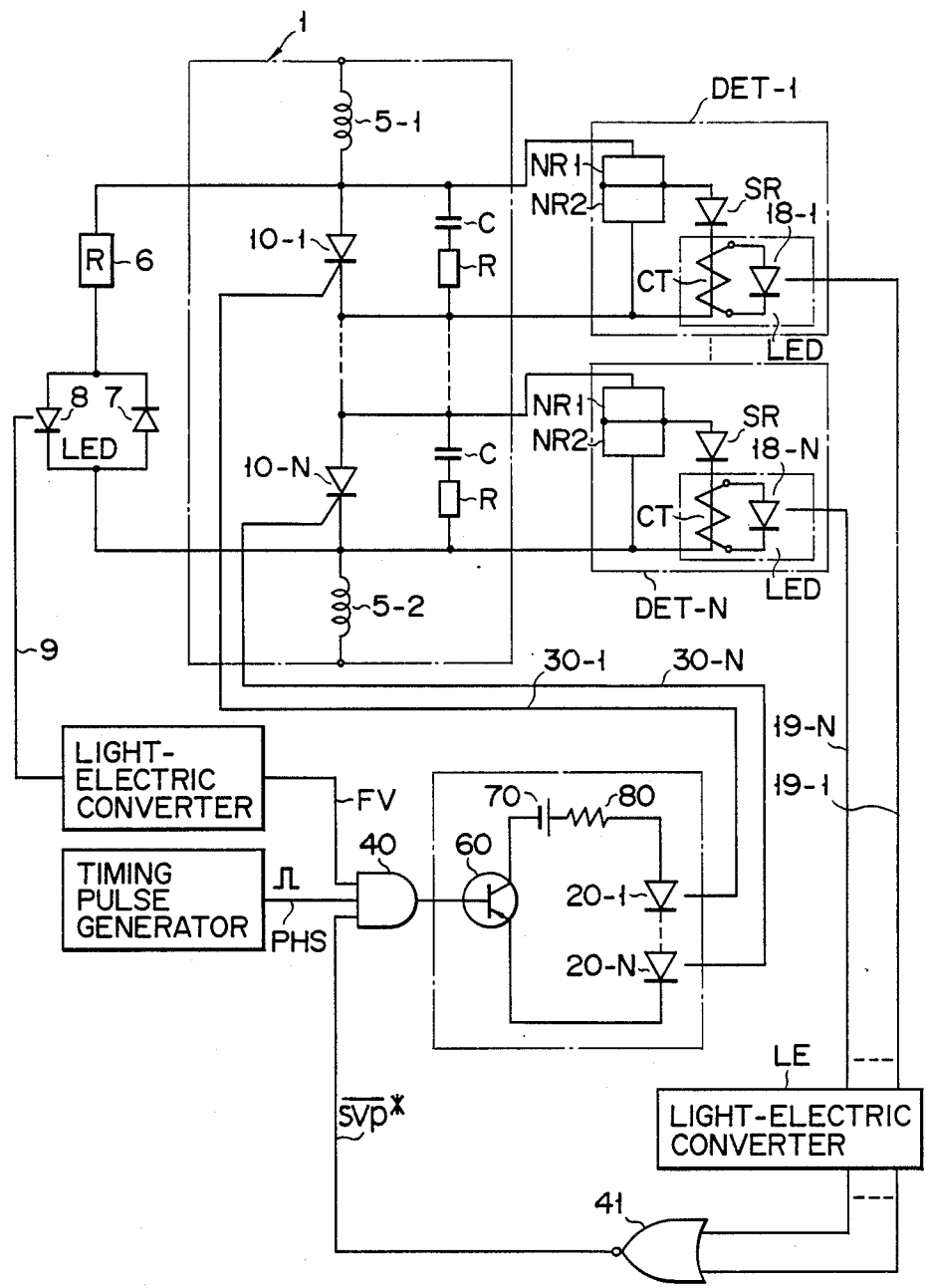
F I G. 10

THYRISTOR VALVE WITH IMPROVED GATE PULSE GENERATING SCHEME

BACKGROUND OF THE INVENTION

1. Field of the Invention

This invention relates to a high-voltage and large-capacity thyristor valve constituted by a plurality of thyristors in series-parallel connection.

2. Description of the Related Art

FIG. 4 is a circuit diagram of a thyristor valve used in a typical rectifier circuit. In FIG. 4, 1-1 to 1-6 denote thyristor valves which are triggered directly by a light signal, for example, and 2-1 to 2-6 denote overvoltage protection arresters, or protection elements such as nonlinear resistors (hereinafter referred to as arresters), which are respectively connected in parallel with the thyristor valves valve arrester. Further, 3 denotes a conversion transformer, and 4 denotes a D.C. reactor.

The thyristor valves with the construction described above will be subjected to an overvoltage in the following cases:

An overvoltage, caused by accident or lightning stroke in the primary side of converter transformer 3 of FIG. 4, is transmitted to the thyristor valve, via converter transformer 3.

An overvoltage is transmitted from D.C. side of the thyristor valve.

In either cases, an overvoltage applied to the thyristor valve is limited by protection level VP of arrester 2, and it will not exceed VP.

Therefore, it is necessary to take the following two conditions into consideration for designing the thyristor valve.

(1) The thyristor valve can withstand the maximum overvoltage or protection level VP of the valve arrester while it is kept in the nonconductive state.

(2) The thyristor valve can withstand the stress caused when it is turned on while the arrester is in operation, that is, when it is turned on while the arrester is operated and the thyristor valve voltage is clipped at VP after an overvoltage is applied to the thyristor valve.

Since, in the case (2), there is no correlation between the overvoltage of the thyristor valve and the gate pulse, the thyristor valve may actually be turned on while the arrester is operated.

FIGS. 7A and 7B show the result of detail analysis made by the inventor of this invention using an equivalent circuit of FIG. 6 with respect to the stress caused in the case (2). (It should be noted that the following analysis is not publicly known.) FIG. 7A shows the relation between voltage (Vs), current (i), and time, and FIG. 7B shows the relation between time and junction temperature rises Tj1 and Tj6 in the thyristor.

For reference, FIGS. 8A and 8B show the result of analysis of the stress caused at the time of turn-on of the thyristor valve when the arrester operation is not effected (c or the arrester is not provided).

In FIG. 6, Lo denotes a commutation reactance, E an overvoltage source, iA an arrester current, i1 to i6 thyristor currents, and Vs1 to Vs6 thyristor voltages. In the example of calculation, six series-connected thyristors are provided, five thyristors (10-2 to 10-6) out of them are turned on at the same time, and the remaining one is turned on with a delay time of 0.85 μs.

The following fact will be found from the results shown in FIGS. 7 and 8.

In the case shown in FIG. 7 (in the case of turn-on occurring during the operation of the arrester).

The turn-on overvoltage ratio (K2):
K2=Vs6/Vs1=3.80/2.95=1.29.

Junction temperature rise ratio (Kj):
Kj=Tj6/Tj1=1.51.

In the case shown in FIG. 8 (in the case of turn-on without the arrester operation).

The turn-on overvoltage ratio (K2*):
K2*32 Vs6/Vs1=3.70/3.20=1.16.

Junction temperature rise ratio (Kj*):
Kj*=Tj6/Tj1=1.20.

Thus, K2>K2* and Kj>Kj*, and it is understood that the turn-on stress caused in the arrester operation is severer. Such severe turn-on stress may seem to be caused by the following reason. That is, the operation of the arrester equivalently provides a constant voltage source of VP connected between the terminals of the thyristor valve. If, in this state, the thyristor valve is turned on, rush current iL1, flowing from the power source side to the thyristor, is limited only by series-connected reactors (5-1, 5-2). In contrast, in the case under no arrester operation, rush current iL1 is limited by a series circuit of commutation reactance Lo and series-connected reactors (5-1, 5-2).

Therefore, according to a design for a thyristor valve having the conventional construction, the necessary number of series thyristors in the thyristor valve is determined as follows, with the aforementioned conditions (1) and (2) taken into consideration.

First, the number (N1) of series thyristors, necessary for satisfying condition (1), is determined as follows.

$$N1 \geq VP \times Kt \times K1/VDRM \tag{1}$$

where

VP : protection level of the arrester,

Kt : test safety factor (1.15 in IEC standard),

K1 : voltage distribution factor among series thyristors, and

VDRM : a forward withstand voltage of the thyristor (a turn-on capability at this level is not guaranteed)

The number (N2) of series thyristors necessary for satisfying condition (2) is determined as follows.

$$N2 \geq VP \times Kt \times K1 \times K2/VDRM(ON) \tag{2}$$

where VDRM(ON) (VDRM>VDRM(ON)) is a maximum permissible thyristor voltage at which the thyristor can be turned on, and is a function of the rate of the rise of the current flowing into the thyristor (di/dt). FIG. 9 shows the relation between these VDRM(ON) and di/dt.

K2 is a turn-on overvoltage ratio.

The desired number of series-connected thyristors must be set to a larger one of N1 and N2.

From eq. (1) and (2), the following equation can be derived:

$$N2/N1 = [VDRM/VDRM(ON)] \times K2 \tag{3}$$

It is understood from eq.(3) that it is preferable to set VDRM/VDRM(ON) and K2 as close to 1.0 as possible from the viewpoint of the thyristor valve design, and it is ideal if N1=N2 is attained.

For this purpose, the series reactance is to be increased so that di/dt is reduced, and the thyristor is to be selected so as to suppress variation in the turn-on delay time. However, these manners increase the cost and there is a practical limitation.

For example, even when VDRM/VDRM(ON)=1.0, eq. (3) can be rewritten as N2=K2·N1.

Thus, the necessary number of series thyristors is set to be N2 so as to satisfy the condition (2). This means that the number of series-connected thyristors is equal to K2 times N1. According to the analysis described above, the series number must be set to a value equal to N1 times K2 (=1.29).

It is clearly understood from the aforementioned analysis that the number of series-connected thyristors cannot be determined at a low cost when the conventional thyristor valve is designed.

SUMMARY OF THE INVENTION

An object of this invention is to provide for a thyristor valve, which can reduce the necessary number of series-connected thyristors so that the cost of the thyristor valve and the conduction loss thereof are both reduced.

The object can be attained by a thyristor valve protected from an overvoltage by means of an arrester or the like, comprising a voltage detector (DET) for detecting a forward voltage (FV) applied to the thyristor valve (10) and generating an output signal when the detected voltage exceeds a predetermined voltage (Vp*) which is set lower than the protection level of the arrester; and a circuit (40) for inhibiting a gate pulse from being applied to the thyristor valve (10) in response to the output signal from the voltage detector (DET).

Use of the inhibition circuit (40) permits the gate pulse to be applied to the thyristor only when the condition of the presence of conduction command signal PHS and forward voltage signal FV, and the absence of output signal $_s\overline{Vp^*}$ of the voltage detector, is satisfied. That is, a signal ($_sVp^* =$ "0") for inhibiting the trigger of the thyristor is transmitted to gate pulse generation circuit 12 before a voltage applied to the thyristor reaches the protection level of the arrester, thus preventing the turn-on of the thyristor while the arrester is operated. As the result, the necessary number of series thyristors can be determined in the following manner:

(1) Since a condition for the maximum overvoltage (VP), causing no turn-on operation, is the same as in the conventional case, the necessary number (N1) of series thyristors can be determined as follows from eq.(1):

$$N1 = VP \times Kt \times K1/VDRM$$

(2) Under a condition for the maximum overvoltage (Vp*), causing the turn-on operation, the necessary number (N3) of series thyristors is determined as follows:

$$N3 \geq VP^* \times Kt \times K1 \times K2^*/VDRM \text{ (ON)} \quad (4)$$

where Vp*<VP, and K2* denotes the turn-on overvoltage ratio in a condition that the arrester is not operated.

Therefore, the following equation can be obtained:

$$N3/N1 = [VDRM/VDRM(ON)] \times [Vp^*/VP] \times K2^* \quad (5)$$

According to the analysis in this invention, K2*=1.16 is obtained and this value is smaller by approx. 10% than K2=1.29 obtained in the analysis of the aforementioned conventional case.

When VDRM/VDRM(ON)=1.1 and K2*=1.16 are substituted in eq.(5), the following equation (6) can be obtained:

$$N3/N1 = 1.1 \times [Vp^*/VP] \times 1.16 = 1.28 \times [Vp^*/VP] \quad (6)$$

In order to attain N3/N1=1, it is only necessary to satisfy the following equation (7):

$$Vp^* = [1/1.28] \times VP = 0.78 \times VP \quad (7)$$

As described above, when thyristor valve voltage Vp* for inhibiting the turn-on operation is set to 78% of protection level VP of the arrester, then N1=N3 is obtained and an optimum design can be achieved. In the conventional design, it is necessary to set the number of series-connected thyristors to N2=K1×N1=1.29×N1. In contrast, according to this invention, N3=1.00×N1 is obtained and the number of series thyristors can be reduced by 29% from the conventional case.

BRIEF DESCRIPTION OF THE DRAWINGS

FIG. 10 is a modification of the circuit shown in FIG. 5 wherein a current transformer (CT) and a nonlinear resistor (NR) are provided in each voltage detecting section;

DETAILED DESCRIPTION OF THE PREFERRED EMBODIMENTS

Now, the embodiments of this invention is described with reference to FIGS. 1A and 1B.

Figure 1A:
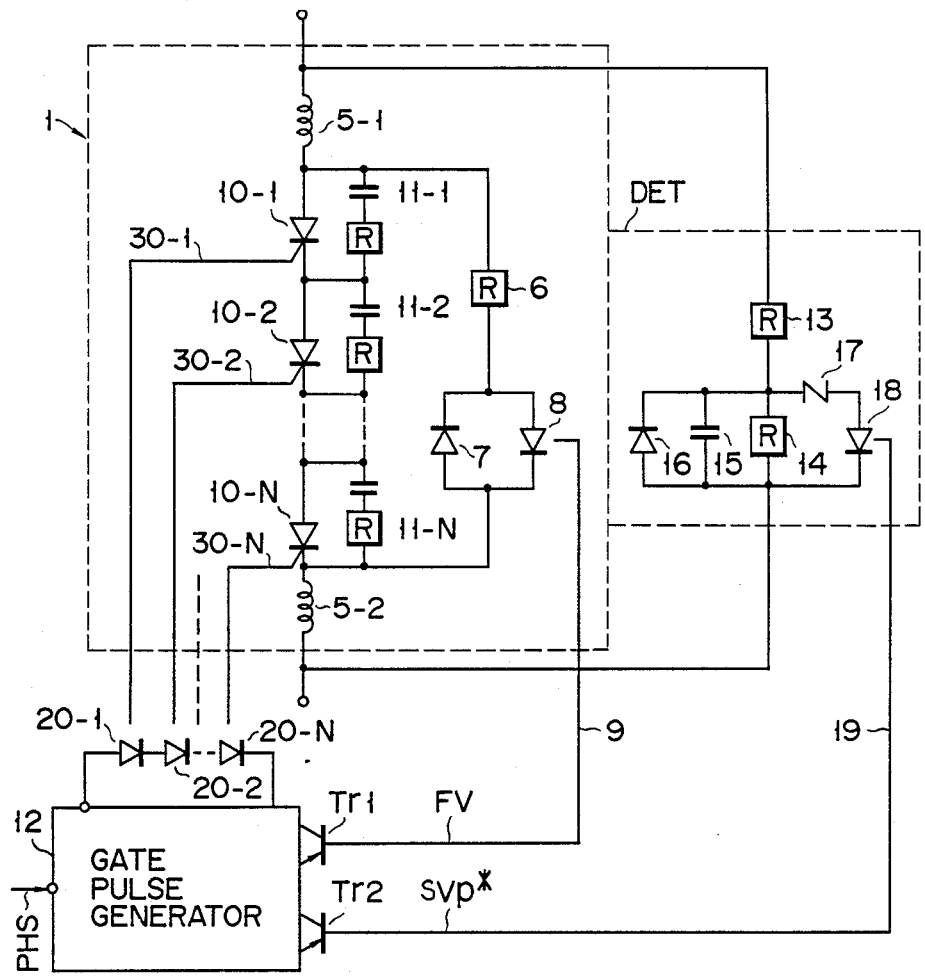
FIG. 1A shows a thyristor valve according to one embodiment of this invention.
Figure 1B:
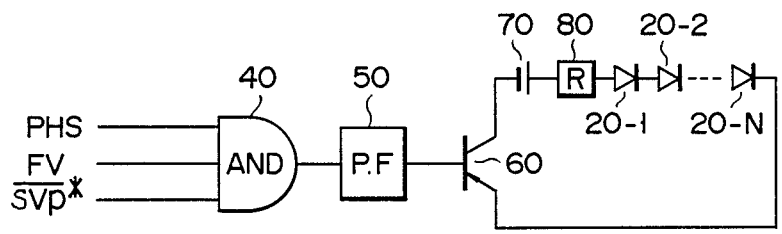
FIG. 1B shows a concrete construction of a gate pulse generator shown in FIG. 1A.
Figure 4:
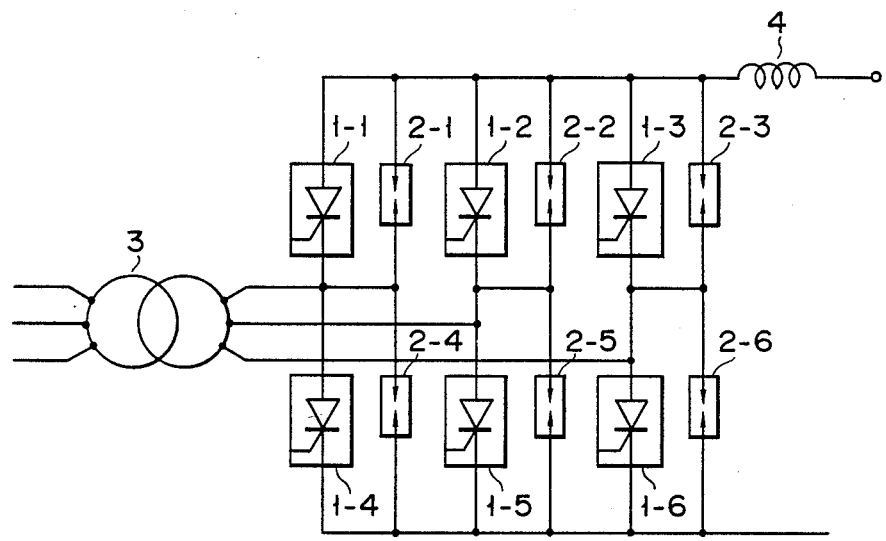
FIG. 4 shows an example of an ordinary circuit of a rectifier device which is constructed by thyristor valves.

FIG. 1A is a diagram showing the construction of for the thyristor valve according to the present invention, and FIG. 1B is a diagram schematically showing the construction of gate pulse generating circuit 12 for turning on the thyristor in FIG. 1A. The thyristor valve of FIG. 1A can be applied to the device shown in FIG. 4, for example.

A plurality (N) of thyristors 10 (10-1 to 10-N) which are triggered directly by light signals are serially connected. In order to activate the series-connected thyristors as one thyristor valve 1, the thyristor valve is provided with voltage dividing circuits 11-1 to 11-N for equalizing voltages applied respectively to thyristors 10-1 to 10-N, and D.C. reactors 5-1 and 5-2 each for buffering the turn-on stress of the thyristors.

Gate pulses for turning on the thyristors are generated from light emitting diodes 20-1 to 20-N of gate pulse generating circuit 12, and are fed to the gates of the respective light-triggered thyristors, via light guides 30-1 to 30-N.

In order to generate signal FV for detecting the forward voltage applied to the thyristor section, an anti-parallel-connected circuit of diode 7 and light emitting diode 8 is connected in series with resistor 6 in the thyristor section, and light from light emitting diode 8 is transmitted to gate pulse generating circuit 12, via light guide 9. In generation circuit 12, phototransistor Tr1 is connected to receive FV signal and uses the signal as one of the gate generating conditions.

In order to drive gate pulse generating circuit 12 to supply gate pulses to the thyristor valve, conduction command signal PHS is generated from a control device (control panel) which is not shown in FIG. 1A. Generation circuit 12 generates gate pulses with a predetermined width when three conditions, i.e., the presence of conduction command signal PHS, the presence of forward voltage signal FV from the thyristor valve, and the absence of signal $_sVp^*$, are satisfied at the same time.

A voltage detector DET supplies an output signal $_sVp$ to a gate pulse generator of the thyristor valve when a voltage applied to the thyristor valve exceeds predetermined voltage (Vp*) lower than the protection level (Vp) of the arrester. The voltage detector includes a series circuit of resistors 13 and 14; capacitor 15 connected in parallel with resistor 14; diode 16; and a series circuit of trigger diode 17 and light emitting diode 18. Voltage detection signal $_sVp^*$ from light emitting diode 18 is transmitted to phototransistor Tr2 of gate pulse generating circuit 12, via light guide 19. Further, a gate pulse generated from gate pulse generating circuit 12 is converted to light signals by means of light emitting diodes 20-1 to 20-N, and the light signals are transmitted to the gates of light-triggered thyristors 10-1 to 10-N, via light guides 30-1 to 30-N. Conduction command signal PHS for generation circuit 12 is supplied from a control device (control panel) or timing pulse generator (not shown) to generation circuit 12.

As is shown in FIG. 1B, in gate pulse generating circuit 12, AND circuit 40 is connected to receive conduction command signal PHS, forward voltage signal FV, and signal $_s\overline{Vp^*}$. Signal $_s\overline{Vp^*}$ is set to logic level "1" when a voltage applied to the thyristor valve is lower than predetermined voltage (Vp*) which is set below the protection level of the arrester. AND circuit 40 supplies an output signal to the base of transistor 60, via pulse shaping circuit (one-shot circuit) 50. Light emitting diodes 20-1 to 20-N, resistor 80, power source 70, and transistor 60 are serially connected. When transistor 60 is turned on, current flows, via light emitting diodes 20-1 to 20-N, to generate light signals.

When a forward voltage is applied to the thyristor valve, a current flows into resistor 14 and capacitor 15, via resistor 13. When the voltage applied to the thyristor valve reaches a predetermined level (Vp*), a voltage across capacitor 15 exceeds the trigger level of trigger diode 17 which in turn is activated to supply current to light emitting diode 18. A light signal from light emitting diode 18 is supplied to phototransistor Tr2 of gate pulse generating circuit 12, via light guide 19. Thus, whether or not a voltage higher than predetermined level Vp* is applied to the thyristor valve can be detected at generation circuit 12. The value of the predetermined level can be adjusted by use of resistor 13, capacitor 5, and trigger diode 17.

Therefore, an output signal from AND circuit 40 shown in FIG. 1B causes a pulse current to flow into the base of transistor 60 which in turn causes light emitting diodes 20-1 to 20-N to generate light gate signals only when conduction command signal PHS and forward voltage signal FV are present and a voltage higher than predetermined voltage (Vp*) is not applied to the thyristor valve (i.e., $_s\overline{Vp^*}$ = logic "1").

Thus, when a voltage higher than predetermined level Vp* is applied to the thyristor valve, the logic signal of $_s\overline{Vp^*}$ becomes "0", and AND circuit 40 generates no output signal, preventing a gate pulse (trigger signal) from being supplied to the thyristor valve.

Figure 5:
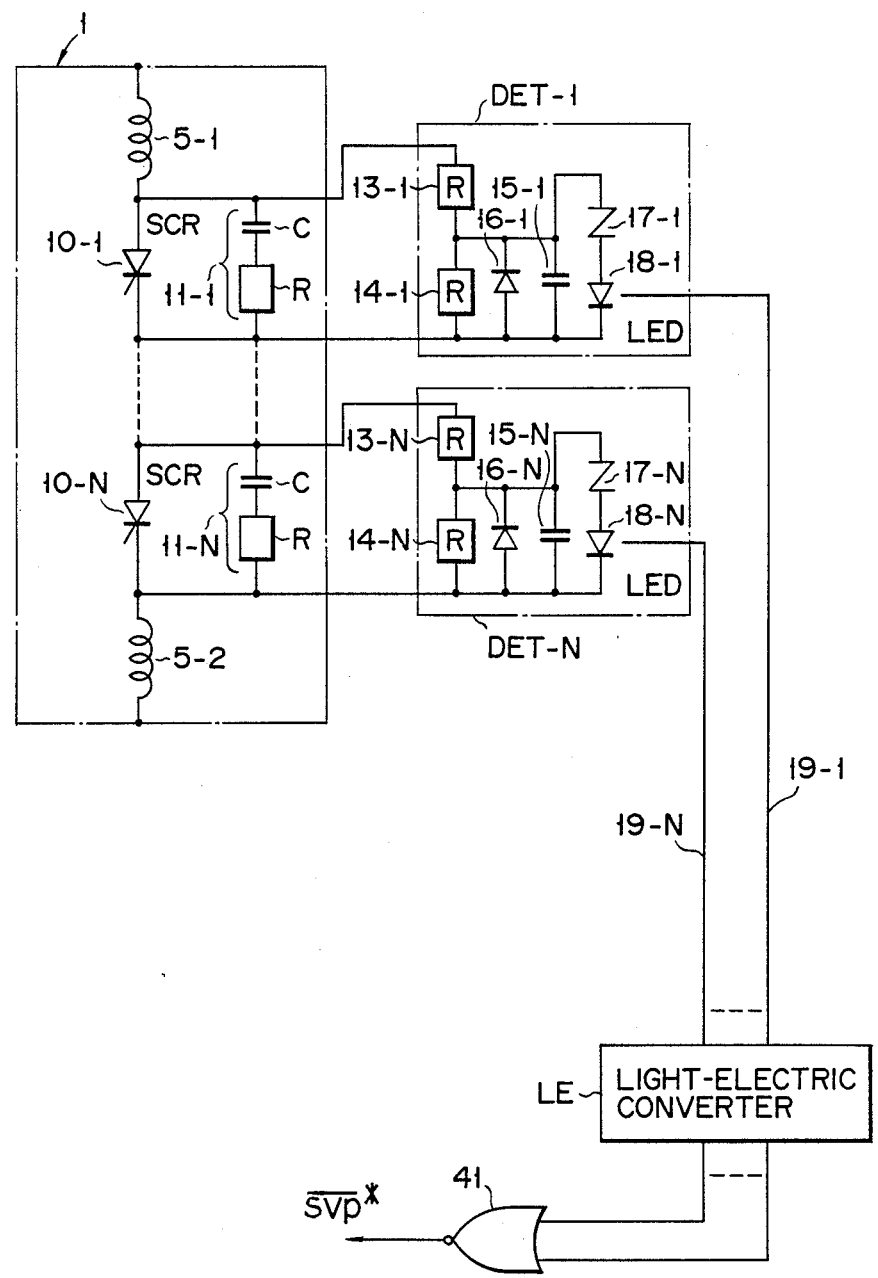
FIG. 5 is a modification of the thyristor valve shown in FIG. 1A wherein a plurality of voltage detecting sections are provided for respective thyristors and the inverted logical sum of outputs from the voltage detecting sections is derived as the voltage detection result ($_s\overline{Vp^*}$)
Figure 6:
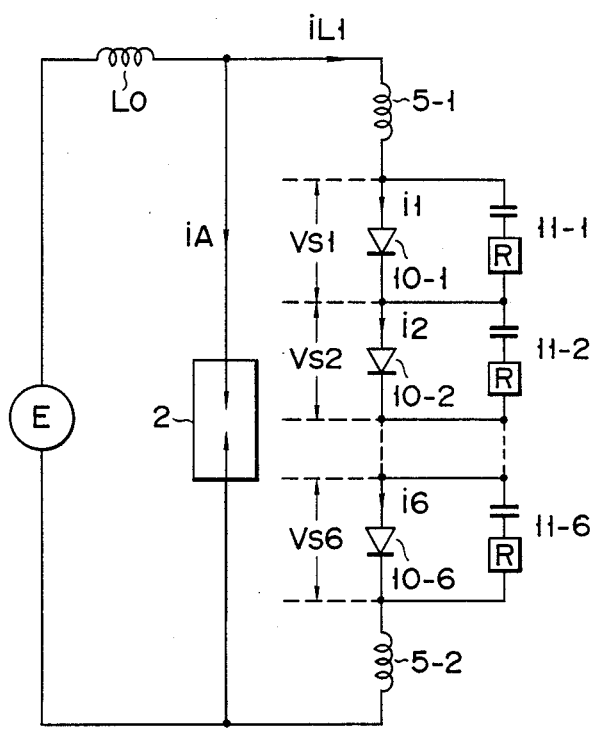
FIG. 6 shows an equivalent circuit used for analyzing the turn-on stress in the thyristor valve.
Figure 9:
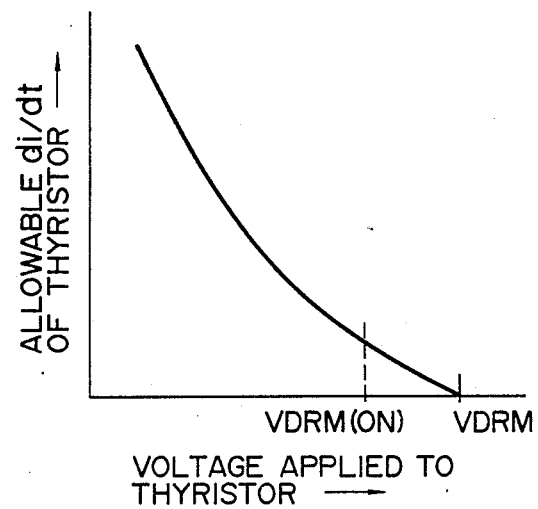
FIG. 9 is a graph showing the relation between a voltage applied to the thyristor and the permissible value of di/dt when the thyristor is turned-on at the voltage level.
Figure 7A:
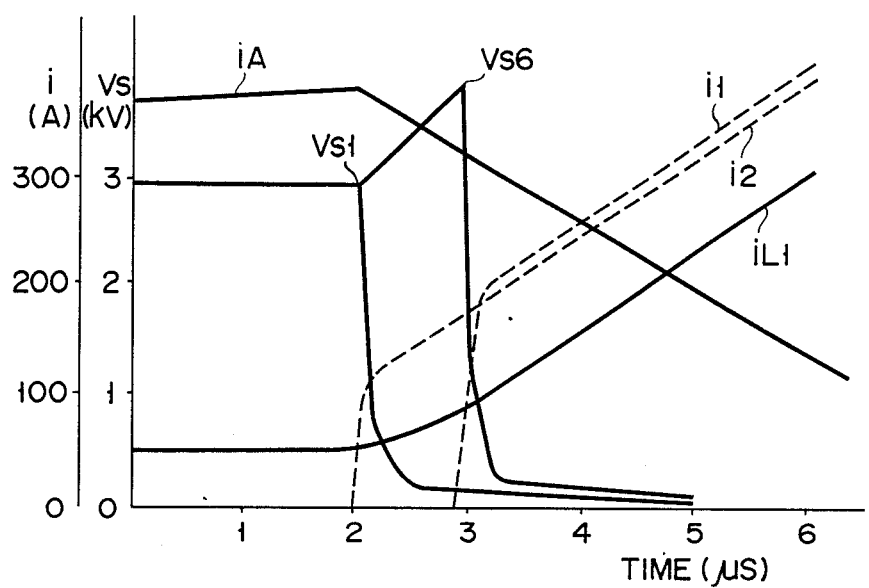
FIGS. 7A and 7B show the result of the analysis which is effected for the turn-on stress when the arrester (2) is operated.
Figure 7B:
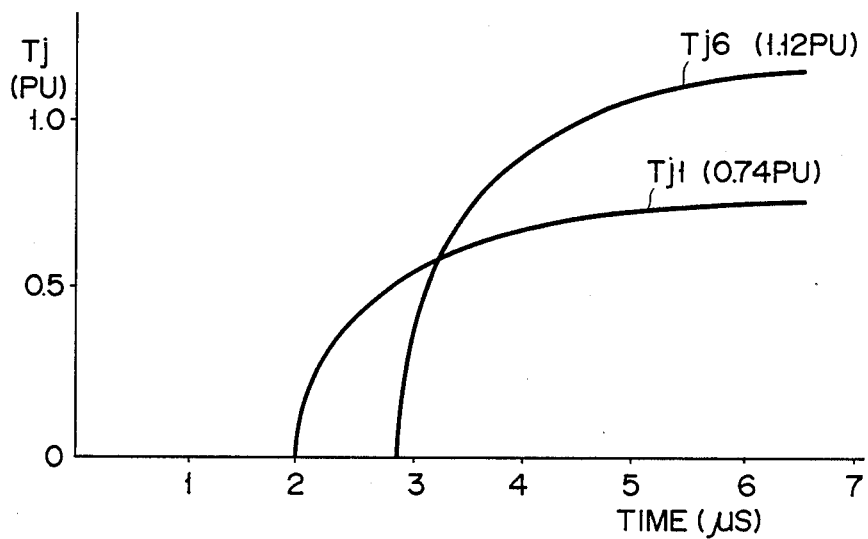
Figure 8A:
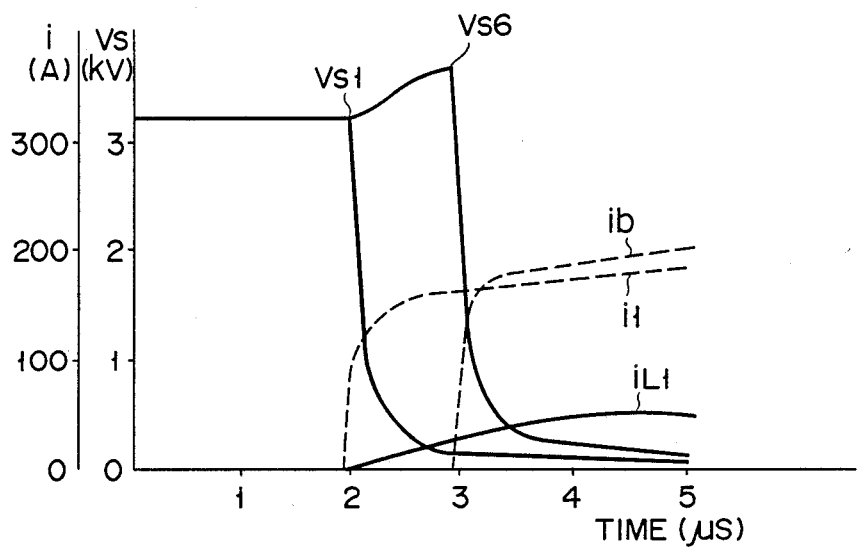
FIGS. 8A and 8B show the result of the analysis which is effected for the turn-on stress when the arrester (2) is not provided or not operated.
Figure 8B:
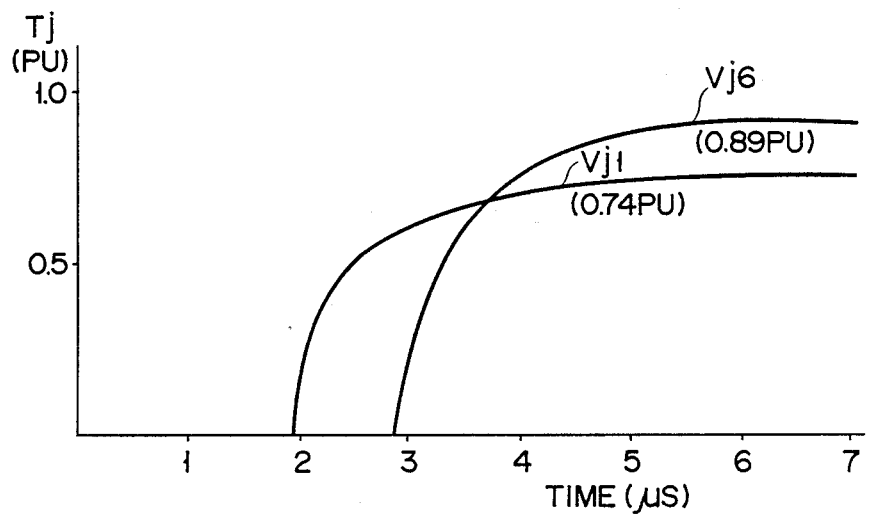

In FIG. 1A, the voltage detector for detecting predetermined level Vp* is connected to thyristor valve 1. However, it is possible to detect a voltage across part of the thyristor valve and determine whether or not a voltage across the thyristor valve has reached the predetermined level (Vp*) based on the detected voltage. This corresponds to the case where only one of voltage detectors DET in FIG. 5 is used.

Figure 2:
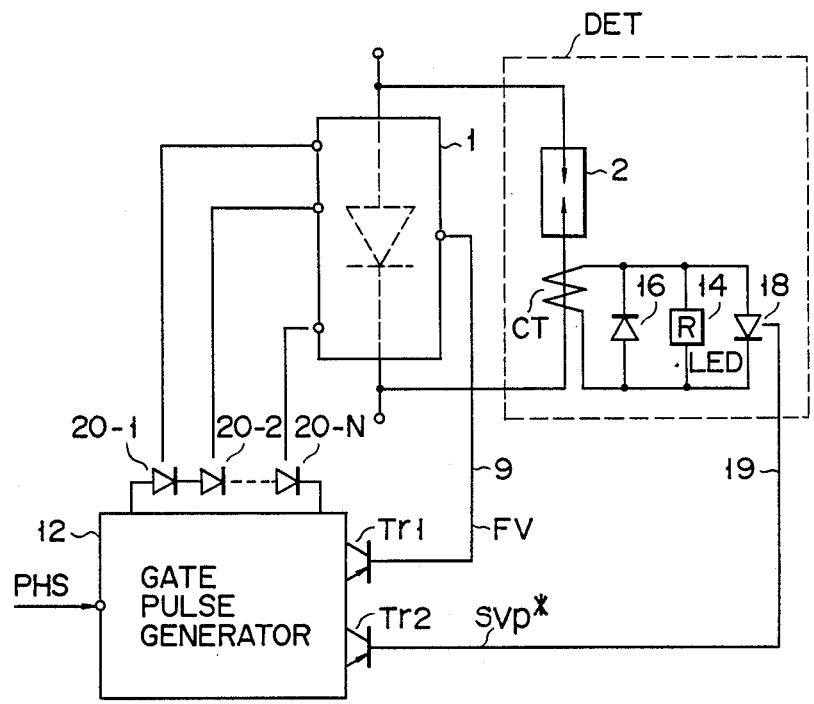
FIG. 2 shows a thyristor valve according to another embodiment of this invention wherein a current transformer (CT) is used in a voltage detecting section.

In FIG. 2, portions corresponding to those portions in FIG. 1A are denoted by the same symbols or reference numerals. As shown in FIG. 2, a current (ip) flowing through arrester 2 is detected by current transformer CT. Current ip*, flowing when the voltage across the thyristor valve has reached the predetermined level (Vp*), is detected by light emitting diode 18 which is activated by current larger than ip*, and light emitted from diode 18 as the result of detection is transmitted to gate pulse generating circuit 12, via light guide 19.

Figure 3:
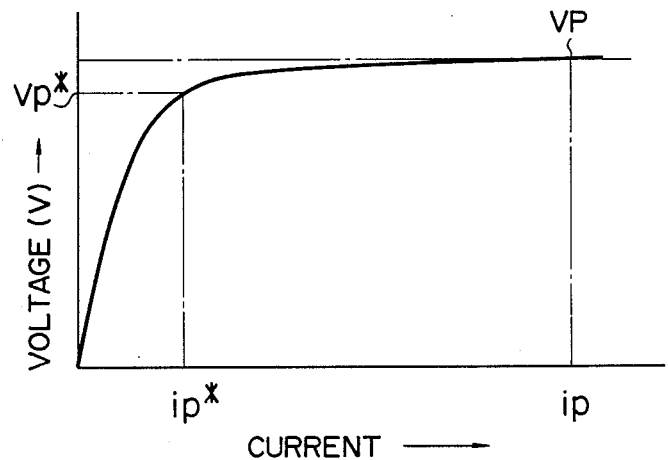
FIG. 3 is a graph showing the voltage-current characteristics of an arrester (2)

Thus, since the relation between the current and voltage of arrester 2 is expressed by the characteristic curve shown in FIG. 3, it becomes possible to detect predetermined voltage Vp* lower than protection level VP of arrester 2, by detecting current ip* corresponding to voltage Vp*.

In the case where the turn-on overvoltage of the thyristors (10-1 to 10-N) in the thyristor valve is within 10% of the rated value, the ratio (Vp*/VP) of Vp* to VP in FIG. 3 is set equal to or smaller than 0.9 (90%). This setting may reduce the number of necessary thyristors (10-1 to 10-N) by approx. 10% in comparison with the case where $_s\overline{Vp^*}$ is not used in the construction of FIG. 1B. The ratio of Vp*/VP is not necessarily limited to 90% but may generally be set to 80 to 90%.

FIG. 5 is a modification of the overvoltage protection circuit in FIG. 1A. In the FIG. 5 circuit, voltage detecting sections DET-1 to DET-N are provided for respective thyristors 10-1 to 10-N. Light outputs from the detecting sections are converted to electric signals by means of light-electric converter LE and then supplied to NOR gate 41 which in turn produces a corresponding inverted logical sum as voltage detection result $_s\overline{Vp^*}$.

FIG. 10 is a modification of the circuit of FIG. 5. In the FIG. 10 circuit, a combination of voltage-dividing circuit of nonlinear resistors NR1 and NR2 and current transformer CT is used in each of voltage detecting sections DET-1 to DET-N.

Figure 11:
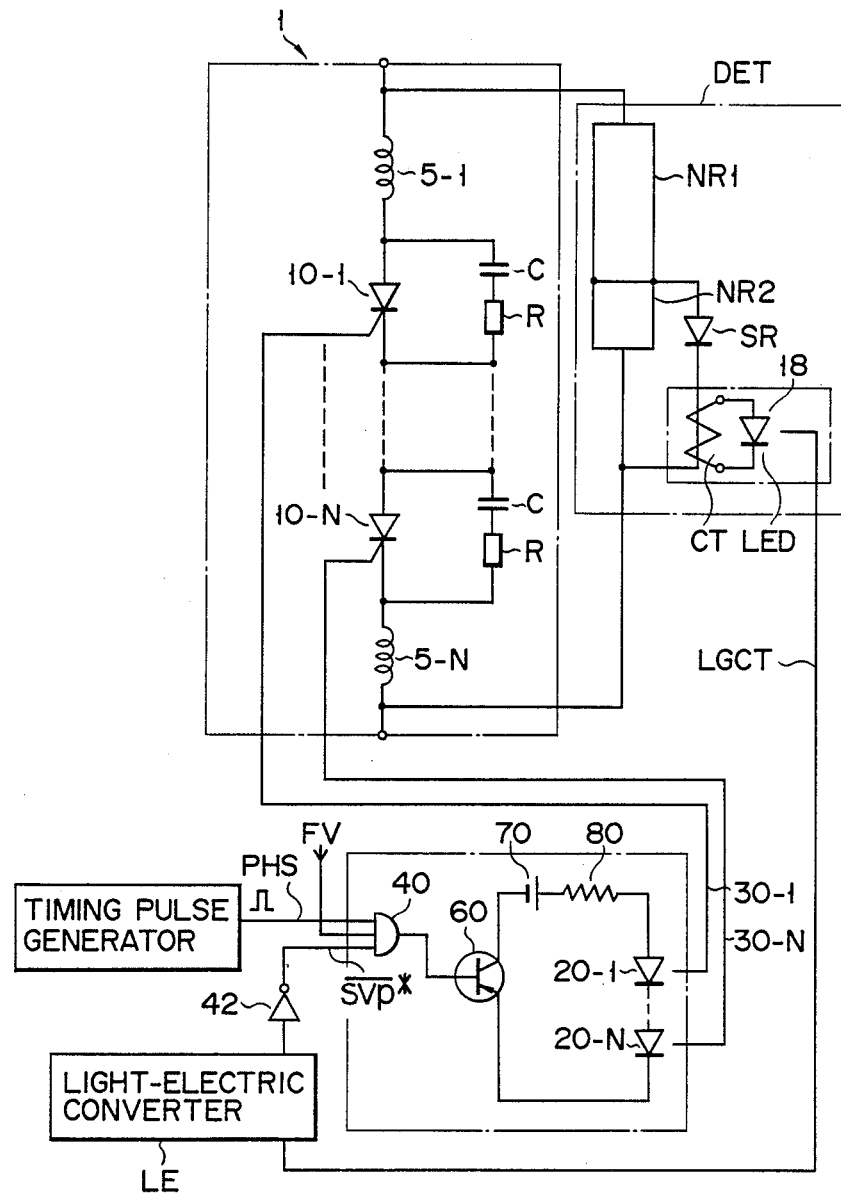
FIG. 11 is a modification of the circuit shown in FIG. 2 wherein nonlinear resistor (NR) is used instead of the arrester (2) in the voltage detecting section.

FIG. 11 is a modification of the circuit of FIG. 2. In the FIG. 11 circuit, nonlinear resistors NR1 and NR2 and current transformer CT are used, instead of the combination of arrester 2 and current transformer CT, in the voltage detecting section. Light output LGCT generated from LED 18 driven by output current of current transformer CT is converted to signal $_s\overline{Vp^*}$ by means of light-electric converter LE and inverter 42, and then supplied to AND gate 40.

Figure 12:
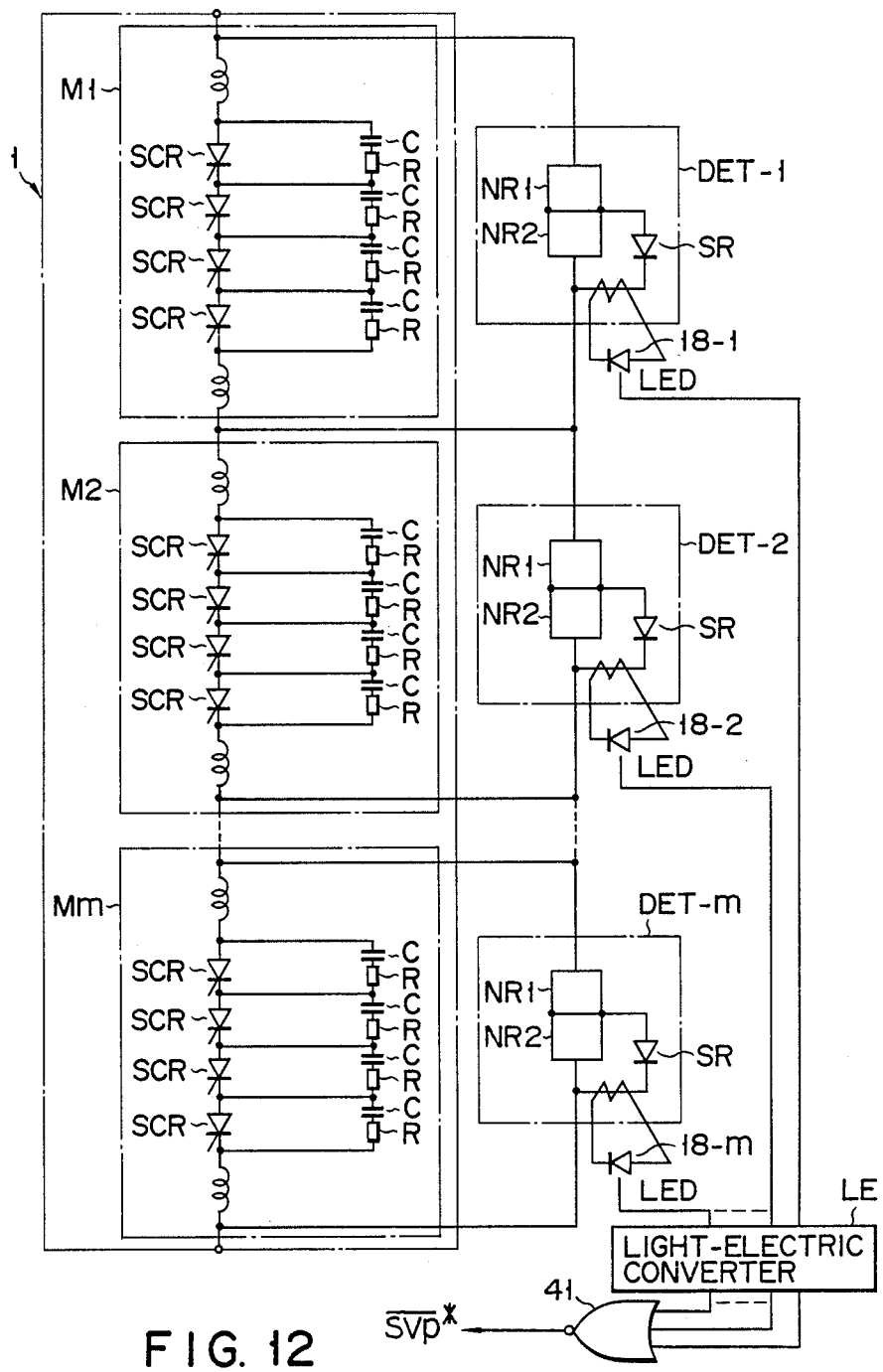
FIG. 12 shows a thyristor valve according to still another embodiment of this invention wherein the same voltage detecting section as that of FIG. 10 is provided in each of a plurality of thyristor valve modules (M1 to Mm) which are serially connected.

FIG. 12 shows the thyristor valve according to another embodiment of this invention. In the FIG. 12 circuit, voltage detecting sections DET-1 to DET-m which are the same as those in FIG. 10 are provided in series-connected thyristor valve modules M1 to Mm, respectively. An inverted logical sum of detected outputs of the voltage detecting sections is used as voltage detection result $_s\overline{Vp^*}$.

Figure 13:
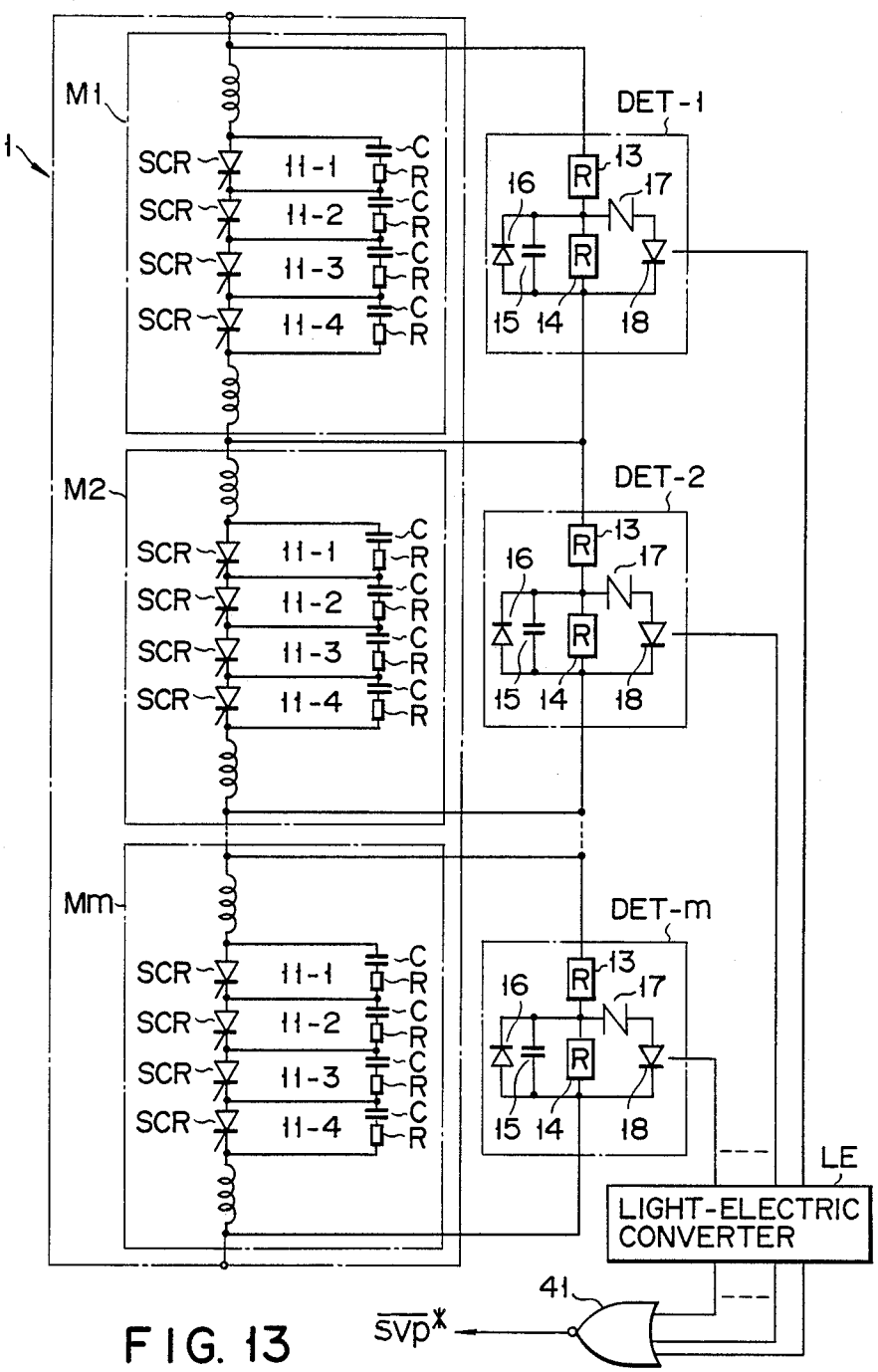
FIG. 13 is a modification of the circuit of FIG. 12 wherein the same voltage detecting section as that of FIG. 5 is provided in each of the plurality of series-connected thyristor valve modules.

FIG. 13 is a modification of the FIG. 12 circuit. In the FIG. 13 circuit, voltage detecting sections DET-1 to DET-m which are the same as those in FIG. 5 are provided in series-connected thyristor valve modules M1 to Mm, respectively. An inverted logical sum of detected outputs of the voltage detecting sections is used as voltage detection result $_s\overline{Vp^*}$.

The embodiments of FIGS. 10 to 13 correspond to circuits obtained by combining the following U.S. patent with the idea of this invention (that is, the idea of using $_sVp^*$ or $_s\overline{Vp^*}$ as one condition of generating the gate pulse). The entire contents disclosed in the following U.S. patent are incorporated in the present patent application:

U.S. Pat. No. 4,414,599,
Patent Date: Nov. 8, 1983
Title: "ARRESTER AND A SEMICONDUCTOR CIRCUIT ARRANGEMENT WITH A PROTECTION DEVICE INCLUDING THE SAME"
Inventor: Kobayashi According to this invention, the turn-on operation can be prevented during the operation of the arrester, which will cause an extremely severe turn-on stress. Therefore, it is only necessary to consider the turn-on stress, occurring at voltage level Vp* lower than protection level VP of the arrester, as the severest turn-on stress of the thyristor valve. Then, the necessary number of series-connected thyristors can be reduced as described before. Thus, the thyristor valve, which is low in cost and has a small conduction loss, can be obtained.

What is claimed is:

1. A thyristor valve circuit comprising:
   at least one thyristor valve to be protected from an overvoltage exceeding a predetermined protection level and including a plurality of series-connected thyristors;
   inhibit level detecting means, connected to said thyristor valve, for generating an inhibit signal when a voltage applied to said thyristors exceeds a predetermined inhibit level which is lower than the predetermined protection level; and
   gate pulse generating means, connected to said thyristor valve and inhibit level detecting means, for generating gate pulses to trigger said thyristors when the inhibit signal is not generated, and inhibiting generation of the gate pulses when the inhibit signal is generated,
   wherein when variation in the turn-on overvoltage of said thyristors falls within $\pm X\%$ of the rated value thereof, the predetermined trigger inhibit level is set not larger than 100%-X% of the predetermined protection level.

2. A thyristor valve circuit comprising:
   at least one thyristor valve to be protected from an overvoltage exceeding a predetermined protection level and including a plurality of series-connected thyristors;
   inhibit level detecting means, connected to said thyristor valve, for generating an inhibit signal when a voltage applied to said thyristors exceeds a predetermined inhibit level which is lower than the predetermined protection level; and
   gate pulse generating means, connected to said thyristor valve and inhibit level detecting means, for generating gate pulses to trigger said thyristors when the inhibit signal is not generated, and inhibiting generation of the gate pulses when the inhibit signal is generated,
   wherein said thyristor valve includes forward voltage detecting means for generating a forward voltage signal when a forward voltage is applied to said thyristors; and
   said gate pulse generating means including a gate circuit for controlling generation of the gate pulse based on the logic AND of a given conduction signal, the forward voltage signal, and the inhibit signal.

3. A thyristor valve circuit according to claims 1 or 2, wherein an arrester which restricts a voltage applied across the thyristor valve to said predetermined protection level is connected to said thyristor valve.

4. A thyristor valve circuit according to claim 2 wherein said inhibit level detecting means includes arrester current detecting means, connected to said arrester, for generating the inhibit signal to inhibit the generation of the gate pulses when a current flowing in said arrester exceeds a current level corresponding to the predetermined trigger inhibit level.

5. A thyristor valve circuit according to claims 1 or 2, wherein said inhibit level detecting means includes a voltage detecting circuit for generating the inhibit signal in response to a voltage applied across all of said series-connected thyristors.

6. A thyristor valve circuit according to claims 1 or 2, wherein said inhibit level detecting means includes voltage detecting circuits for generating the inhibit signal in response to voltages which are respectively applied to plural thyristors among said series-connected thyristors.

7. A thyristor valve circuit according to claims 1 or 2, wherein there are provided a plurality of said thyristor valves which are serially connected, and said thyristor valves further comprise voltage detecting circuits for generating the inhibit signal in response to voltages which are respectively applied to plural thyristor valves among said series-connected thyristor valves.

8. A thyristor valve circuit having a plurality of series-connection thyristors, comprising:

first forward voltage detecting means connected to said thyristor valve, for generating a first forward voltage detection signal to determine a valve firing timing, in accordance with a first forward voltage detection signal;

second forward voltage level detecting means connected to said thyristor valve, for generating a second forward voltage detection signal to inhibit firing of the thyristor valve when a voltage applied to said thyristor valve exceeds a predetermined forward voltage level which is higher than the first forward voltage detection level of said first forward voltage detecting means and lower than a protection level of a valve arrester connected to said thyristor valve; and gate pulse generating means, connected to said thyristor valve, for generating gate pulses to fire said thyristor valve when the first forward voltage detection signal is generated but the second forward voltage detection signal is not generated, and inhibiting the generation of said gate pulses when the second forward voltage detection signal is generated.

9. A thyristor valve circuit according to claim 8, wherein said second forward voltage detecting means detects a current flowing in said valve arrester and generates the second forward voltage detection signal under a condition that the detected current exceeds a predetermined value.

* * * * *